(12) United States Patent
Hung

(10) Patent No.: US 9,343,445 B2
(45) Date of Patent: May 17, 2016

(54) PHOTOELECTRIC CONVERSION DEVICE

(71) Applicant: HON HAI PRECISION INDUSTRY CO., LTD., New Taipei (TW)

(72) Inventor: Yi Hung, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 322 days.

(21) Appl. No.: 13/927,151

(22) Filed: Jun. 26, 2013

(65) Prior Publication Data
US 2014/0145070 A1 May 29, 2014

(30) Foreign Application Priority Data
Nov. 28, 2012 (TW) .............................. 101144607 A

(51) Int. Cl.
| H01J 3/16 | (2006.01) |
| H01L 25/16 | (2006.01) |
| H01L 31/0232 | (2014.01) |
| G02B 6/42 | (2006.01) |

(52) U.S. Cl.
CPC ............ *H01L 25/167* (2013.01); *G02B 6/4214* (2013.01); *G02B 6/4231* (2013.01); *H01L 31/02325* (2013.01); *G02B 6/4206* (2013.01); *G02B 6/4246* (2013.01); *H01L 2924/0002* (2013.01)

(58) Field of Classification Search
CPC .. G02B 6/4206; G02B 6/4214; G02B 6/4231; G02B 6/4246; H01L 31/02327; H01L 25/167; H01L 31/02325; H01L 2924/0002
USPC .......................... 250/216, 551; 385/33, 39, 89
See application file for complete search history.

(56) References Cited

U.S. PATENT DOCUMENTS

| 7,421,160 | B1 * | 9/2008 | Budd et al. ...................... 385/33 |
| 2006/0056765 | A1 * | 3/2006 | Hwang .................... G02B 6/43 385/39 |
| 2006/0274997 | A1 * | 12/2006 | Furuno et al. .................. 385/89 |
| 2007/0237459 | A1 * | 10/2007 | Watte et al. ..................... 385/39 |
| 2007/0258720 | A1 * | 11/2007 | Gorrell et al. ................. 398/140 |
| 2012/0224814 | A1 * | 9/2012 | Hirano et al. ................... 385/49 |
| 2014/0099057 | A1 * | 4/2014 | Sun et al. ........................ 385/33 |
| 2014/0193119 | A1 * | 7/2014 | Isenhour et al. ................ 385/77 |
| 2014/0199019 | A1 * | 7/2014 | Yabre ............................. 385/14 |
| 2015/0016772 | A1 * | 1/2015 | Arao .................... G02B 6/4273 385/14 |
| 2015/0117824 | A1 * | 4/2015 | Wang ....................... G02B 6/32 385/93 |
| 2015/0338590 | A1 * | 11/2015 | Morioka .............. G02B 6/4249 385/33 |

* cited by examiner

*Primary Examiner* — Seung C Sohn
*Assistant Examiner* — Kevin Wyatt
(74) *Attorney, Agent, or Firm* — Novak Druce Connolly Bove + Quigg LLP

(57) ABSTRACT

A photoelectric conversion device includes a circuit board, a light emitting module, a light receiving module, and an optical coupling lens. Two protrusions apart from each other extend from the circuit board. The light emitting module and the light receiving module are mounted on the circuit board and apart from each other. The optical coupling lens includes an oblique reflection surface and a recess having a bottom surface parallel to the circuit board. Two distanced posts perpendicularly extend from the bottom surface and engage with the centers of the protrusions upon assembly to ensure automatic and alignment of the light emitting module with the first converging lens, and alignment of the light receiving module with the second converging lens.

12 Claims, 3 Drawing Sheets

PHOTOELECTRIC CONVERSION DEVICE

BACKGROUND

1. Technical Field

The present disclosure relates to photoelectric conversion devices.

2. Description of Related Art

A photoelectric conversion device includes a circuit board, a light emitting module, a light receiving module, and an optical coupling lens. The light emitting module and the light receiving module are mounted on the circuit board. The optical coupling lens includes a first converging lens and a second converging lens. The first converging lens is intended to be aligned with and optically coupled with the light emitting module, and the second converging lens is intended to be aligned with and optically coupled with the light receiving module. Light emitted from the light emitting module passes through the first converging lens, and light from the second converging lens reaches the light receiving module. The transmission efficiency of light depends on a precise alignment between the first converging lens and the light emitting module and between the second converging lens and the light receiving module. In particular, the higher the alignment precision is, the higher is the transmission efficiency. Therefore, it is important to design a photoelectric conversion device having an automatically precise alignment between the first converging lens and the light emitting module and between the second converging lens and the light receiving module.

DETAILED DESCRIPTION

Figure 1:
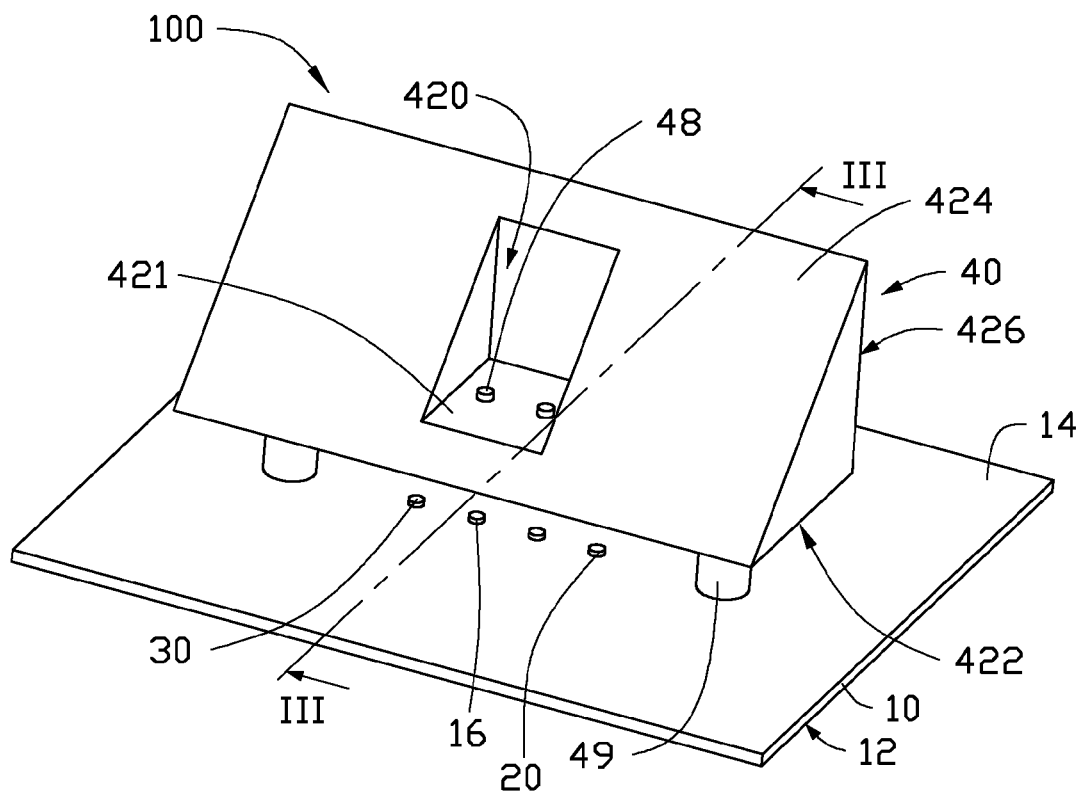
FIG. 1 is a schematic, isometric view of a photoelectric conversion device, according to an exemplary embodiment.

Referring to FIG. 1, a photoelectric conversion device 100, according to an exemplary embodiment, includes a circuit board 10, a light emitting module 20, a light receiving module 30, and an optical coupling lens 40.

The circuit board 10 includes a lower surface 12 and an upper surface 14. The lower surface 12 and the upper surface 14 are positioned at opposite sides of the circuit board 10, and the lower surface 12 is parallel to the upper surface 14. Two protrusions 16 perpendicularly extend from the upper surface 14. In this embodiment, the protrusions 16 are cylindrical. That is, if the protrusions 16 are cut in a plane parallel to the upper surface 14, the cross-section of each of the protrusions 16 is perfectly circular.

The light emitting module 20 and the light receiving module 30 are mounted on the upper surface 14 and electrically connected to the circuit board 10. In detail, the light emitting module 20, the light receiving module 30, and the two protrusions 16 are arranged in a straight line, and the two protrusions 16 are located between the light emitting module 20 and the light receiving module 30. That is, centers of the light emitting module 20, of the light receiving module 30, and of the two protrusions 16 are arranged in a straight line. In this embodiment, the light emitting module 20 is a vertical cavity surface emitting laser (VCSEL) diode and is configured for emitting light. The light receiving module 30 is a photo diode and is configured for receiving light.

Figure 2:
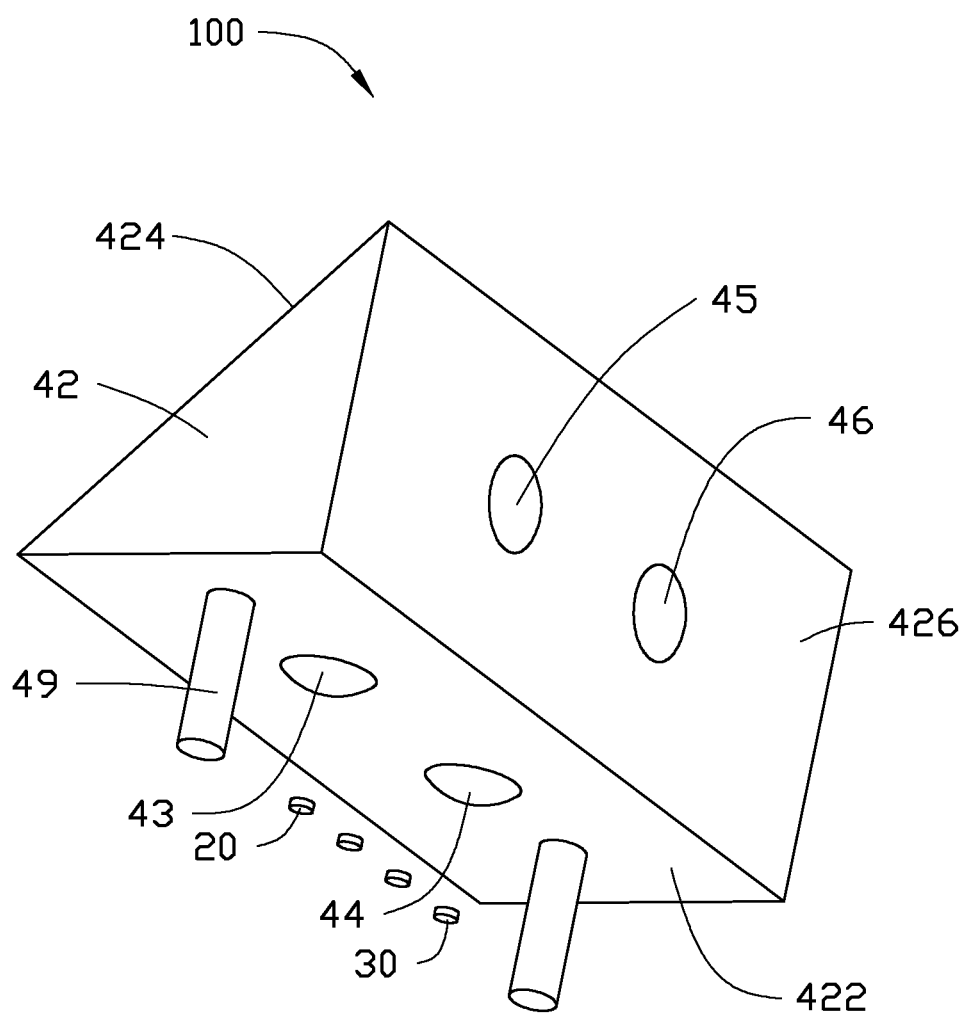
FIG. 2 is a partial, schematic, isometric view of the photoelectric conversion device of FIG. 1.

Referring to FIGS. 1-2, the optical coupling lens 40 includes a transparent body portion 42, a first converging lens 43, a second converging lens 44, a third converging lens 45, a fourth converging lens 46, two posts 48, and two supports 49.

The body portion 42 is a straight triangular prism and includes a light incident surface 422, a reflection surface 424, and a light output surface 426. The light incident surface 422 is parallel to the upper surface 14. The light output surface 426 perpendicularly extends from the light incident surface 422. The reflection surface 424 is obliquely interconnected between the light incident surface 422 and the light output surface 426. In this embodiment, an included angle between the light incident surface 422 and the reflection surface 424 is about 45 degrees, and an included angle between the light output surface 426 and the reflection surface 424 is about 45 degrees. A recess 420 is defined in the reflection surface 424. The recess 420 includes a bottom surface 421 parallel to the light incident surface 422 and the upper surface 14.

The first converging lens 43 and the second converging lens 44 are formed on the light incident surface 422 and arranged apart from each other. The third converging lens 45 and the fourth converging lens 46 are formed on the light output surface 426 and arranged apart from each other. The two posts 48 are located on the bottom surface 421 and arranged apart from each other. In this embodiment, the two posts 48 are cylindrical. That is, if the posts 48 are cut in a plane parallel to the upper surface 14, the cross-section of each of the posts 48 is perfectly circular. The two supports 49 perpendicularly extend from the light incident surface 422 and are arranged apart from each other. In this embodiment, the first converging lens 43, the second converging lens 44, and the two supports 49 are arranged in a straight line, and the first converging lens 43 and the second converging lens 44 are located between the two supports 49.

The first converging lens 43, the second converging lens 44, the protrusions 16, the light emitting module 20, and the light receiving module 30 can be observed along a direction perpendicular to and above the bottom surface 421 because the body portion 42 is transparent. The first converging lens 43, the second converging lens 44, and the two posts 48 are arranged in a straight line, and the two posts 48 are located between the first converging lens 43 and the second converging lens 44.

The locational relationship between the first converging lens 43 and the two posts 48 is substantially the same as that of the light emitting module 20 and the two protrusions 16, and the locational relationship between the second converging lens 44 and the two posts 48 is substantially the same as that of the light receiving module 30 and the two protrusions 16. In detail, the distance between a center of the first converging lens 43 and a center of each of the posts 48 is equal to the distance between a center of the light emitting module 20 and a center of each of the protrusions 16. The distance between a center of the second converging lens 44 and a center of each of the posts 48 is equal to the distance between a center of the light receiving module 30 and a center of each of the protrusions 16. The diameter of each of the posts 48 is substantially equal to the diameter of each of the protrusions 16, and the diameters of each of the posts 48 exceeds the diameters of the first converging lens 43 and the second converging lens 44.

In alternative embodiments, the posts 48 may be may be triangular, rectangular, or elliptic and the cross-section of each of the protrusions 16 may accordingly be triangular, rectangular, or elliptic, the dimensions of each of the posts 48 always being the same as the dimensions of each of the protrusions 16.

When the photoelectric conversion device 100 is assembled, the optical coupling lens 40 is adhered onto the upper surface 14 with adhesive. In detail, first, the optical coupling lens 40 is placed on the upper surface 14. In this situation, the two supports 49 abut the upper surface 14. Second, the optical coupling lens 40 is moved until the centers of the protrusions 16 are aligned with the centers of the posts 48, while the location of the protrusions 16 can be observed along a direction perpendicular to and above the bottom surface 421. In this situation, where the protrusions 16 completely coincide with the posts 48, the light emitting module 20 is perfectly aligned with the first converging lens 43, and the light receiving module 30 is thus perfectly aligned with the second converging lens 44. Third, glue is applied to sidewalls of the supports 49 to fix the optical coupling lens 40 on the upper surface 14. Thereby, the photoelectric conversion device 100 has a high alignment precision and thus a high transmission efficiency of light.

Figure 3:
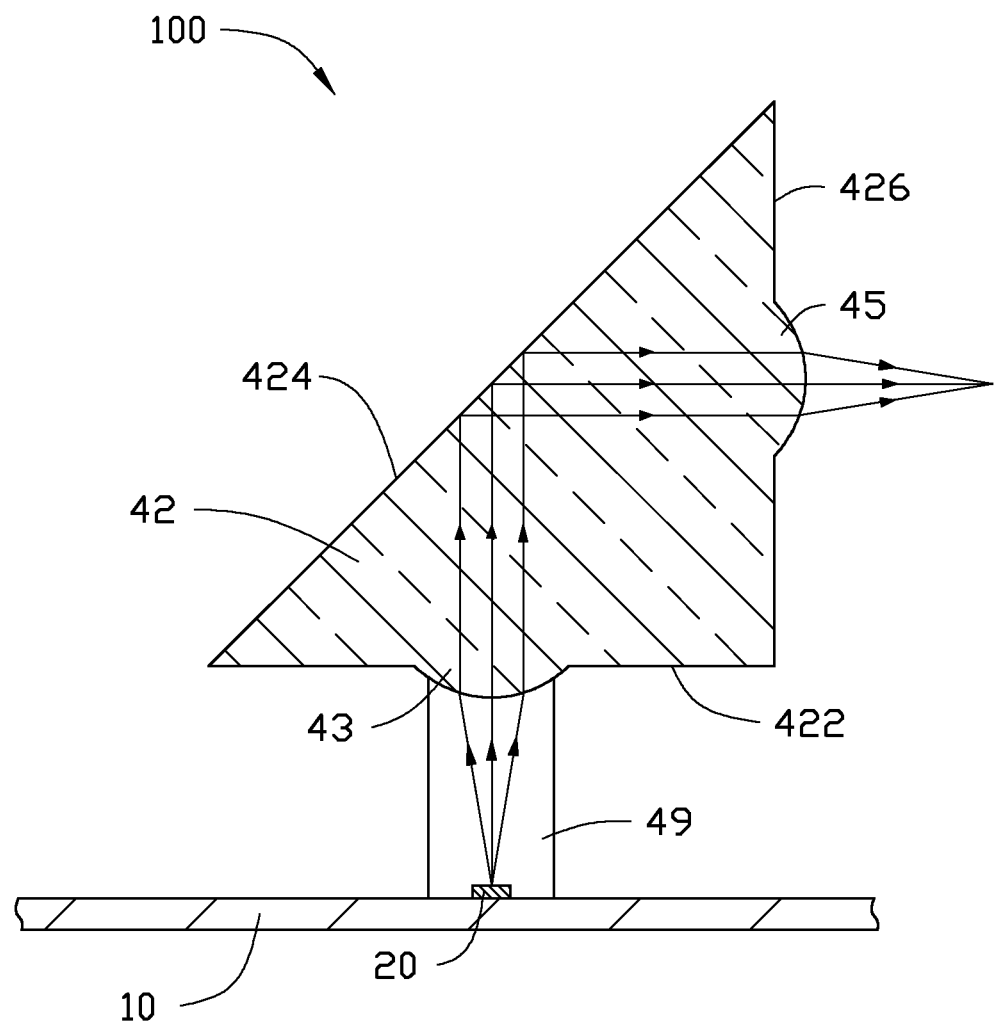
FIG. 3 is a sectional view of the photoelectric conversion device of FIG. 1, taken along the line III-III of FIG. 1.

Referring to FIG. 3, when in use, electrical power is applied to the light emitting module 20 and the light receiving module 30 through the circuit board 10, thus light beams emitted from the light emitting module 20 enter into the first converging lens 43 and become parallel, and are then reflected about 90 degrees toward the light output surface 426 by the reflection surface 424, and finally exit from the light output surface 426. Accordingly, parallel light beams passing through the light output surface 426 are reflected about 90 degrees toward the second converging lens 44, and are finally converged into the light receiving module 30 by the second converging lens 44.

Even though numerous characteristics and advantages of the present embodiments have been set forth in the foregoing description, together with details of the structures and functions of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A photoelectric conversion device comprising:
   a circuit board;
   two spaced protrusions formed on the circuit board;
   a light emitting module mounted on the circuit board;
   a light receiving module mounted on the circuit board and being apart from the light emitting module; and
   an optical coupling lens comprising a light incident surface facing toward the light emitting module and the light receiving module, a reflection surface obliquely connected to the light incident surface, a first converging lens, and a second converging lens, the first and second converging lenses formed on the light incident surface and corresponding to the reflection surface, wherein the reflection surface defines a recess located between the light emitting module and the light receiving module, the recess comprises a bottom surface parallel to the circuit board, two posts perpendicularly extend from the bottom surface and are arranged apart from each other, centers of the posts aligned with centers of the protrusions to ensure alignment of the light emitting module with the first converging lens, and alignment of the light receiving module with the second converging lens, the optical coupling lens further comprises a transparent body portion, the body portion comprises the light incident surface, the reflection surface, and a light output surface, the light incident surface perpendicularly extending from the light output surface.

2. The photoelectric conversion device as claimed in claim 1, wherein the optical coupling lens further comprises two supports, the reflection surface is obliquely interconnected between the light incident surface and the light output surface, the supports perpendicularly extends from the light incident surface and are arranged apart from each other, and the supports are fixed on the circuit board.

3. The photoelectric conversion device as claimed in claim 2, wherein an included angle between the reflection surface and the light output surface is about 45 degrees, and an included angle between the reflection surface and the light incident surface is about 45 degrees.

4. The photoelectric conversion device as claimed in claim 2, wherein the circuit board comprises a lower surface and an upper surface opposite to the lower surface, the light emitting module and the light receiving module are mounted on the upper surface and arranged apart from each other, and the bottom surface is parallel to the upper surface and the light incident surface.

5. The photoelectric conversion device as claimed in claim 4, wherein the optical coupling lens is adhered to the upper surface with adhesive.

6. The photoelectric conversion device as claimed in claim 1, wherein the shape of a cross-section of each of the posts is the same as the shape of a cross-section of each of the protrusions.

7. The photoelectric conversion device as claimed in claim 6, wherein the dimension of each of the posts is the same as the dimension of the cross-section of each of the protrusions.

8. The photoelectric conversion device as claimed in claim 7, wherein each of the posts is cylinder, and each of the protrusions is cylinder.

9. The photoelectric conversion device as claimed in claim 7, wherein a cross-section of each of the posts is triangular, rectangular, or elliptic.

10. The photoelectric conversion device as claimed in claim 1, wherein the light emitting module and the light receiving module are electrically connected to the circuit board.

11. The photoelectric conversion device as claimed in claim 4, wherein the light emitting module, the light receiving module, and the protrusions are arranged in a straight line, and the protrusions are located between the light emitting module and the light receiving module.

12. The photoelectric conversion device as claimed in claim 4, wherein the optical coupling lens further comprises a third converging lens and a fourth converging lens both formed on the light output surface and apart from each other, the reflection surface is configured for reflecting light passing through the first converging lens toward the third converging lens, and reflecting light passing through the fourth converging lens toward the second converging lens.

* * * * *